(12) United States Patent
Suorsa (10) Patent No.: US 10,285,312 B2
(45) Date of Patent: May 7, 2019

(54) METHOD AND APPARATUS FOR CREATING PERFECT MICROWAVE ABSORBING PRINTED CIRCUIT BOARDS

(71) Applicant: Flextronics AP, LLC, Broomfield, CO (US)

(72) Inventor: Peter Suorsa, Amesbury, MA (US)

(73) Assignee: FLEXTRONICS AP, LLC, San Jose, CA (US)

( * ) Notice: Subject to any disclaimer, the term of this patent is extended or adjusted under 35 U.S.C. 154(b) by 276 days.

(21) Appl. No.: 14/216,785

(22) Filed: Mar. 17, 2014

(65) Prior Publication Data
US 2014/0266850 A1 Sep. 18, 2014

Related U.S. Application Data

(60) Provisional application No. 61/791,098, filed on Mar. 15, 2013.

(51) Int. Cl.
*H05K 9/00* (2006.01)
*H01Q 17/00* (2006.01)
*H05K 1/02* (2006.01)

(52) U.S. Cl.
CPC ........... *H05K 9/0088* (2013.01); *H01Q 17/00* (2013.01); *H01Q 17/002* (2013.01); *H05K 1/0236* (2013.01); *G02B 2207/121* (2013.01); *H05K 1/024* (2013.01); *H05K 1/0233* (2013.01); *H05K 2201/083* (2013.01); *Y10T 29/49018* (2015.01); *Y10T 156/1002* (2015.01)

(58) Field of Classification Search
CPC ...... G01S 7/03; H01Q 17/002; H05K 9/0088; H05K 1/0236; H05K 1/0233
USPC .......................................................... 342/1–4
See application file for complete search history.

(56) References Cited

U.S. PATENT DOCUMENTS

| | | | |
|---|---|---|---|
| 3,255,052 | A | 6/1966 | Opitz |
| 3,599,210 | A | 8/1971 | Stander |

(Continued)

FOREIGN PATENT DOCUMENTS

| | | |
|---|---|---|
| CN | 101005730 | 7/2007 |
| CN | 101704312 | 5/2010 |

(Continued)

OTHER PUBLICATIONS

"B-Stage," http://www.ami.ac.uk/courses/topics/0211_pmp/solutions/sol_01.html, Available at: https://web.archive.org/web/20110913114027/http://www.ami.ac.uk/courses/topics/0211_pmp/solutions/sol_01/html (Sep. 13, 2011).

(Continued)

*Primary Examiner* — Peter M Bythrow
*Assistant Examiner* — Helena H Seraydaryan
(74) *Attorney, Agent, or Firm* — Volpe and Koenig, P.C.

(57) ABSTRACT

A method and apparatus for producing a radio frequency absorbing (RFA) or perfect microwave absorbing (PMA) printed circuit board (PCB) is described herein. A metamaterial layer may be applied to a low dielectric substrate. Resistive and capacitive components may then be added to the metamaterial layer. The metamaterial layer may then be formed into an RFA or PMA PCB, which may comprise a multi-layered assembly for absorption of electromagnetic radiation in a targeted frequency range such as the microwave frequency range in the PCB.

18 Claims, 3 Drawing Sheets

(56) References Cited

U.S. PATENT DOCUMENTS

| | | | |
|---|---|---|---|
| 3,733,606 A | 5/1973 | Johansson | |
| 4,162,496 A | 7/1979 | Downen et al. | |
| 4,490,283 A | 12/1984 | Kleiner | |
| 4,846,699 A | 7/1989 | Glover et al. | |
| 5,187,220 A | 2/1993 | Richart et al. | |
| 5,202,535 A | 4/1993 | Dauwen et al. | |
| 5,229,773 A | 7/1993 | Dauwen et al. | |
| 5,258,596 A | 11/1993 | Fabish et al. | |
| 5,545,474 A | 8/1996 | Podlaseck et al. | |
| 5,656,081 A * | 8/1997 | Isen | B41N 1/16 101/153 |
| 5,786,785 A | 7/1998 | Gindrup et al. | |
| 5,872,534 A | 2/1999 | Mayer | |
| 6,225,939 B1 | 5/2001 | Lind | |
| 6,486,822 B1 | 11/2002 | Peterman | |
| 6,538,596 B1 | 3/2003 | Gilbert | |
| 6,756,932 B1 | 6/2004 | Barker et al. | |
| 7,256,753 B2 | 8/2007 | Werner et al. | |
| 7,719,477 B1 | 5/2010 | Sievenpiper | |
| 7,750,869 B2 * | 7/2010 | Mosallaei | B33Y 80/00 343/787 |
| 8,013,777 B2 | 9/2011 | Sim et al. | |
| 8,063,116 B2 | 11/2011 | Trogolo et al. | |
| 8,164,506 B2 | 4/2012 | Sim et al. | |
| 8,179,298 B2 | 5/2012 | Sim | |
| 8,674,792 B2 | 3/2014 | Yonak et al. | |
| 2003/0219598 A1 | 11/2003 | Sakurai | |
| 2004/0112403 A1 | 6/2004 | Lewis, III et al. | |
| 2004/0140945 A1 * | 7/2004 | Werner | H01Q 15/0086 343/909 |
| 2004/0169616 A1 | 9/2004 | Schultz et al. | |
| 2006/0150902 A1 | 7/2006 | Stelter et al. | |
| 2007/0251444 A1 | 11/2007 | Gros-Jean et al. | |
| 2009/0040131 A1 | 2/2009 | Mosallaei | |
| 2009/0226673 A1 | 9/2009 | Friedersdorf et al. | |
| 2011/0026234 A1 | 2/2011 | Kim et al. | |
| 2011/0287218 A1 | 11/2011 | Narimanov | |
| 2012/0003844 A1 * | 1/2012 | Kumar | H05K 3/4614 439/55 |
| 2012/0062346 A1 * | 3/2012 | McKinzie, III | H01P 1/16 333/251 |
| 2012/0169525 A1 | 7/2012 | Klar et al. | |
| 2012/0228563 A1 * | 9/2012 | Fuller | F41H 13/0043 252/582 |
| 2012/0235848 A1 | 9/2012 | Bruno et al. | |
| 2013/0063296 A1 | 3/2013 | Hennig et al. | |
| 2013/0257639 A1 | 10/2013 | Takahashi et al. | |
| 2014/0264182 A1 | 9/2014 | Suorsa | |
| 2014/0266849 A1 | 9/2014 | Suorsa | |

FOREIGN PATENT DOCUMENTS

| | | |
|---|---|---|
| CN | 102480035 | 5/2012 |
| CN | 102529229 | 7/2012 |
| CN | 102544668 | 7/2012 |
| CN | 102683831 | 9/2012 |
| CN | 102751582 | 10/2012 |
| CN | 102752995 | 10/2012 |
| CN | 102800943 | 11/2012 |
| CN | 102856663 | 1/2013 |
| EP | 1077507 | 2/2001 |
| EP | 2518823 | 10/2012 |
| WO | 2001/95347 | 12/2001 |
| WO | 2010/109174 | 9/2010 |
| WO | 2012/142830 | 10/2012 |
| WO | 2012/142831 | 10/2012 |
| WO | 12142830 A1 | 10/2012 |
| WO | 12142831 A1 | 10/2012 |

OTHER PUBLICATIONS

"South Bay Circuits Manufacturability Guidelines for Printed Circuit Boards," Available at: https://web.archive.org/web/20090204224845/http://scribd.com/doc/2877555/PCB-Guide (Feb. 4, 2009).

Arnold et al., "A New Magnetic Material of Very High Permeability," Bell System Technical Journal, 2: 3., Permalloy, pp. 101-111 (Jul. 1923).

Crnojevic-Bengin et al., "Fractal Geometries of Complementary Split-Ring Resonators," IEEE Transactions on Microwave Theory and Techniques, vol. 56, No. 10 (2008).

Euro Technologies, "Microwave Absorbing Materials—Introduction to Microwave Absorbers," pp. 3-6, (2004).

Gu et al., "A Broadband Low-Reflection Metamaterial Absorber," Journal of Applied Physics, 108, 064913 (2010).

Gupta et al., "Effect of Annealing Temperature on the Magnetic Behavior of Ni-Rich Permalloy Magnetic Materials," Indian Journal of Engineering and Materials Sciences, vol. 12, pp. 577-585 (Dec. 2005).

IEEE Standard for Information technology—Telecommunications and information exchange between systems—Local and metropolitan area networks—Specific requirements; Part 11: Wireless LAN Medium Access Control (MAC) and Physical Layer (PHY) Specifications, IEEE Std. 802.11-2012 (Mar. 29, 2012).

Jaumann Absorber. In Wikipedia. Retrieved May 13, 2016, from http://wikipedia.org/wiki/Jaumann_absorber.

Kafesaki et al., "Left-handed metamaterials: The fishnet structure and its variations," Physical Review B 75, 235114 (2007).

Kwak et al., "Design of Multilayer PIFA Based on an EBG Structure for SAR Reduction in Mobile Applications," 2009 Asia Pacific Microwave Conference, pp. 645-648, Singapore (2009).

Landy et al., "A Perfect Metamaterial Absorber," Physical Review Letters 100, No. 20 (2008).

MG Chemicals, "Super Shield Nickel Conductive Coating," http://www.mgchemicals.com/products/protective-coatings/emi-rfi-shielding/super-shield-nickel-841, Available at: https://web.archive.org/web/20120923124458/http://www.mgchemicals.com/products/protective-coatings/emi-rfi-shielding/super-shield-nickel-841 (Sep. 23, 2012).

Ramahi et al., "Metamaterials: An Enabling Technology for Wireless Communications," Electrical and Computer Engineering Department, University of Waterloo, (2009).

Salisbury Screen. In Wikipedia. Retrieved May 13, 2016, from http://en.wikipedia.org/wiki/Salisbury_screen.

Salisbury Screen, In Wikipedia, Sep. 13, 2006, Retrieved Aug. 18, 2017 from https://web.archive.org/web/20060913000000/https://en.wikipedia.org/wiki/Salisbury_screen.

Sandora, "Isolation Improvement with Electromagnetic Band Gap Surfaces," Lincoln Laboratory Journal pp. 51-61, vol. 19, No. 1 (2012).

Smith et al., "Composite Medium with Simultaneously Negative Permeability and Permittivity," Physical Review Letters, vol. 84, No. 18, pp. 4184-4187 (May 1, 2000).

Thermal Spray Technologies, Inc., "EMI/RFI Shielding Coatings," http://www.tstcoatings.com/EMI_RFI_shielding.html, Available at: https://web.archive.org/web/20120817023623/http://www.tstcoatings.com/EMI_RFI_shielding.html (Aug. 17, 2012).

Wang et al., "Effects of aspect ratio and particle size on the microwave properties of Fe—Cr—Si—Al alloy flakes," Materials Science and Engineering: A, pp. 178-182, (2007).

Chinese Office Action dated Dec. 21, 2017, in corresponding Chinese Application No. 201480026263.8, with English translation.

* cited by examiner

METHOD AND APPARATUS FOR CREATING PERFECT MICROWAVE ABSORBING PRINTED CIRCUIT BOARDS

CROSS REFERENCE TO RELATED APPLICATIONS

This application claims the benefit of U.S. Provisional Application Ser. No. 61/791,098 filed Mar. 15, 2013, the contents of which are hereby incorporated by reference herein.

BACKGROUND

As technology continues to progress and more and more electronic devices become increasingly common in all industries, the focus on Electromagnetic Interference (EMI) becomes immensely important. Electromagnetic Interference, also known as radio-frequency interference (RFI), is a disturbance that may affect an electrical circuit due to either the electromagnetic induction or radiation emitted from an external source. The external source may be either artificial or natural, making this an extremely hard problem to resolve due to the large amount of variance that the EMI could be sourced from. Devices such as cell phones, tablets, and computers are some of the main emitters of EMI. Electronics such as these could eventually lead to the disruption, degrading, or interruption of the performance of circuits, render them useless, or destroy them completely through interference overload. Every electronic device emits a type of EMI that can be potentially harmful. Thus, the reason for why this problem must be addressed with new technology.

Any electrical or electronic device has the potential to generate conducted and radiated interference. Typical sources of conducted interference may include switching power supplies, alternating current (AC) motors, microwave ovens and microprocessors.

EMI generates unwanted signals from a first circuit, (e.g., a radio, computer chip, computer board, and the like), that may be picked up by a second circuit. This may cause the second circuit to operate less efficiently than desired. In the simplest cases, the second circuit may have "glitches" in its operations, although this may extend to the second circuit yielding incorrect data.

Typically, EMI has been contained at the "box" level of a device, (as dictated by government health and environmental safety regulations), or at best with grounded shielding around a specific component or set of components. In its most extreme form, (i.e., high security/cryptographic environments), the entire device may be enclosed within a shielded room.

Despite there being many types of absorbers, all work through a process of converting unwanted electrical and magnetic emissions into small amounts of heat. The "absorption" strategy is one of attenuation and differs with "shielding" which may be viewed as a strategy of isolation, in that it utilizes conductive material to contain EMI by reflecting the unwanted emissions back towards their source.

Some of the metalized products used by the electronics industry to shield and contain EMI include; metalized gaskets, conductive coatings, shielding tapes, finger stock and an array of ferrite products including beads, toroids, chokes and inductors.

It is quickly becoming apparent that as clock speeds continue to increase, the frequencies emitted will also climb. This will make EMI management an ever-increasing problem. Traditional shielding methods such as finger stock, fabric-over-foam, and board-level shields will prove to be increasingly less effective in these environments. Ironically, it is often these traditional materials that contribute to the resonance problem. They provide a conductive path for energy, which in turn keeps the energy inside the cavity. This contained energy may adversely affect other components on the board and may keep the board from functioning properly. Apart from containment related problems, traditional reflective type shielding technologies simply can no longer hold the waveform . . . it is simply too small at these higher frequencies.

The damaging effects of electromagnetic interference may pose unacceptable risks in many areas of technology, and it is desirable to control such interference and reduce the risks to acceptable levels.

SUMMARY

A method and apparatus for producing a radio frequency absorbing (RFA) or perfect microwave absorbing (PMA) printed circuit board (PCB) is described herein. A metamaterial layer may be applied to a low dielectric substrate. Resistive and capacitive components may then be added to the metamaterial layer. The metamaterial layer may then be formed into an RFA or PMA PCB, which may comprise a multi-layered assembly for absorption of electromagnetic radiation in a targeted frequency range such as the microwave frequency range in the PCB.

BRIEF DESCRIPTION OF THE DRAWINGS

A more detailed understanding may be had from the following description, given by way of example in conjunction with the accompanying drawings wherein.

DETAILED DESCRIPTION

Methods and apparatuses are described herein for producing a radio frequency absorber (RFA) or perfect microwave absorbing (PMA) printed circuit board (PCB) by applying the concept of utilizing unique properties of manufactured metamaterials as absorbers to layers in PCBs. Metamaterial layers in a PCB may be used as RFA or PMA layers in accordance with the embodiments described herein.

Magnetic material, (e.g., permalloy, mu-metal, and the like), may be transformed into a physical format that will work with the appropriate binder and be used in any of the embodiments described herein. Typically, the magnetic material may be processed into a sphere, rod, or flake from the bulk metal. Magnetic materials geometry used in absorbers may indicate that the flake geometry has distinct advantages over other geometries in building successful absorbers. Additionally, the aspect ratio of the material in any geometry may be critical to attaining the maximum permittivity and permeability. This has been attributed, among other things, to the increase of the magnetic moment coupling that increases with surface area. Additionally, the milling process that is used to create the flake may also increase the coercivity, which was attributed to the disordered crystal structure caused by the physical process.

Once the conversion has been completed, the material may be annealed to restore or enhance the permeability. Presumably, the annealing step may restore the coercivity to normal values. This may occur by re-orienting the crystal structure of the material for a permalloy material to create a $NiFe_3$ superlattice structure. Similar effects may occur with other magnetic materials.

Figure 1:
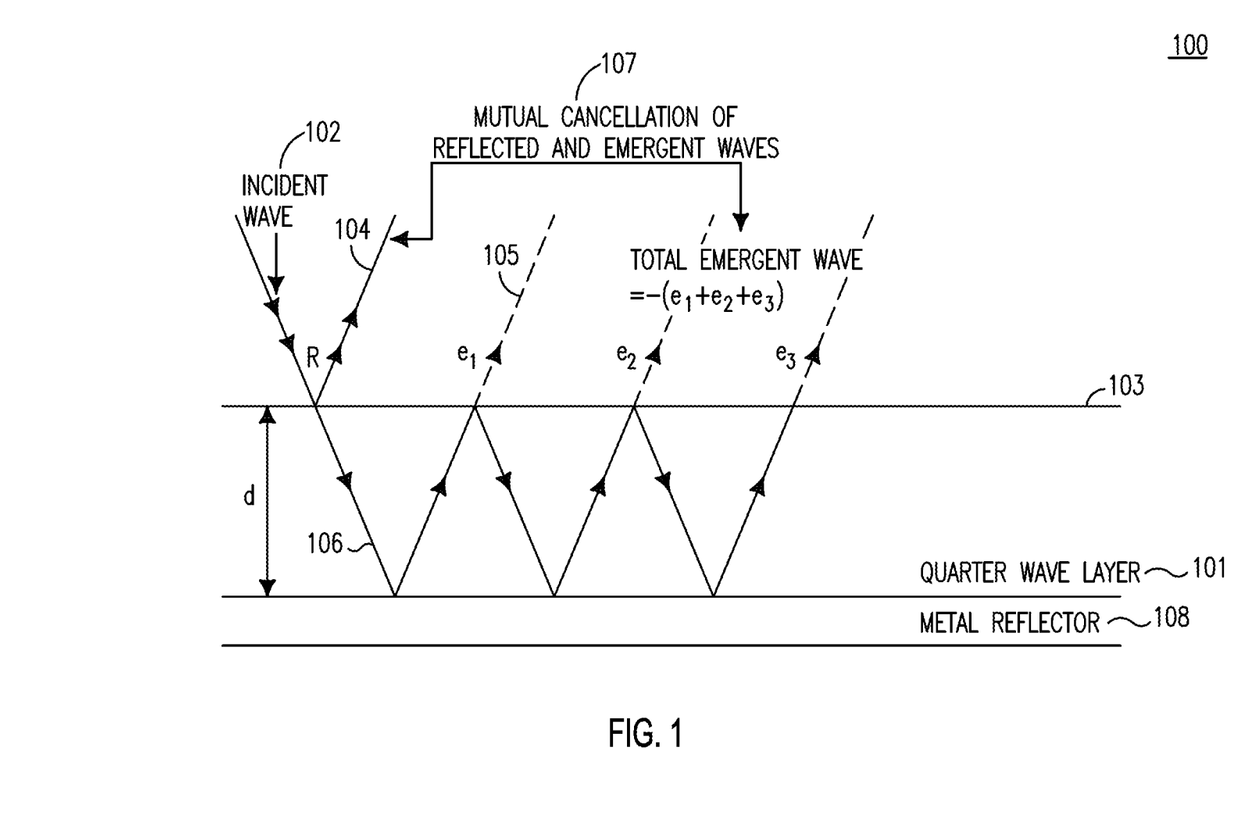
FIG. 1 is an example of the method by which a magnetic resonant frequency (MRF) absorber operates when an out-of-phase condition exists between reflected and emergent waves.

FIG. 1 is an example of the method by which a magnetic resonant frequency (MRF) absorber 100 operates when an out-of-phase condition exists between reflected and emergent waves. For an ideal absorber, (i.e., theoretical maximum absorption), the thickness of the absorber may be one-quarter (¼) of the wavelength 101 of the incident wave 102, whereby part of the incident wave 102 may be reflected 104 from the "air/absorber" boundary 103, and the remaining portion of the incident wave being reflected 106 from the metal conductive reflector 108 surface within the absorber. The reflected wave and emergent wave 105 mutually cancel 107 as a result.

Figure 2:
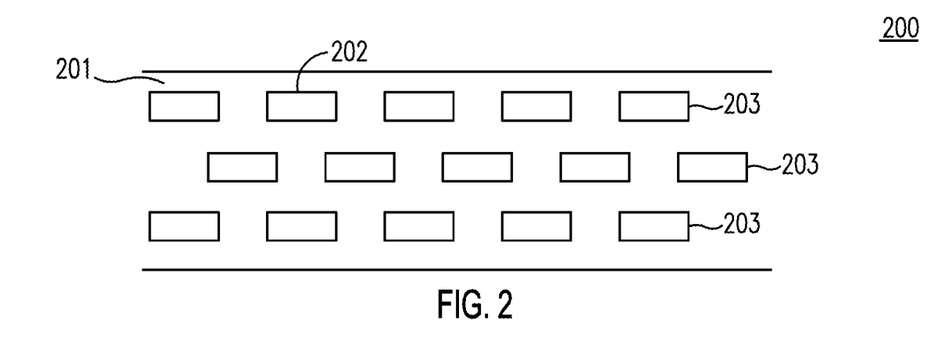
FIG. 2 is an example of stacked "flakes" within an alchemic thin sheet absorber (TSA)

FIG. 2 is an example of stacked "flakes" within an alchemic thin sheet absorber (TSA) 200. The metallic component of the absorber is composed of permalloy flakes 202 so that the dielectric/metal boundary may occur in the first several atom layers of the TSA flake. The TSA may actually be considerably thicker than the thickness dimension of the flake, which may allow multiple layers of flakes 203 to be stacked within the TSA. This may result in multiple incident waves being intercepted resulting in the integration of out-of-phase reflections over the totality of flakes within the TSA combined with the integration of the reflections from the air/dielectric boundary, which may result in the wave being absorbed.

In another embodiment, resonant absorbers produced with "flake" embedded into a dielectric may typically be tuned to a single frequency for maximum attenuation. Multiple frequencies capability may be achieved by changing the physical properties of the film, as well as by including more than one dielectric.

In another embodiment, an alternative annealing process that uses a high temperature or ultra high temperature ceramic may encapsulate the individual component into a thermal shield prior to annealing. Polymorphic Si or SiC may be the materials of choice for this type of high temperature insulator. Alternatively, more exotic materials such as Nitrides of transition metals may be used.

For example, the above described methods may be implemented to build a workable absorber material for a 2.4 GHz application area. Different geometries and aspect ratios may allow different frequency domains to be addressed. Besides merely building an absorber material, the absorber material may be directly incorporated form factors including but not limited to the following printed circuit board (PCB) interlayers, PCB card guides, cables, injection molded parts, wall coverings, powder coated assemblies and or parts, adhesive absorber sheet material.

If one looks at the wavelengths for incident radiation, (e.g., WiFi@2.4 GHz), the "free air" wavelength may be approximately 124 mm, which may result in an extremely thick coating on a product. This thickness may be reduced by inserting the magnetic material into a matrix, (with a known dielectric constant), whereupon the same absorption may be obtained with a material that is $1/\mu\varepsilon$. This takes into account the "stacked flakes" effect.

In one embodiment, technologies deployed in creating a thin, conformal, radar absorbing material (RAM) may include, and are not limited to, planer and or stacked frequency selective surface (FSS) arrays that are printed or etched on a substrate having a specific dielectric constant that promotes optimized attenuation of a specific microwave frequencies.

In another embodiment, technologies deployed in creating a thin, conformal, RAM may include, and are not limited to, all dielectric frequency selective surface technologies, and high permeability spheres sized to optimize wave scattering on the surface of the RAM.

In yet another embodiment, technologies deployed in creating a thin, conformal, RAM may include but are not limited to Chiral/metamaterials designed for unidirectional varying electromagnetic properties, (that control left and right handedness) as well as atomic sputtering. For example, sculptured thin films created through physical vapor deposition processes may be used to deploy this type of material.

In another embodiment, technologies deployed in creating a thin, conformal, RAM may include, and are not limited to smart materials whose microwave reflectivity may be altered and controlled through changes in its resistance when an external electric and or optical filed is applied. High and low level resistance controlled via an electric field may allow for the RAM functions to be switched on and off.

In another embodiment, technologies deployed in creating a thin, conformal, RAM may include, and are not limited to active components that may provide dynamic control of the radar absorbing material.

A combination of all or some of the above-mentioned technologies may be deployed to create a radar absorbing material that is thin enough to meet the form factor requirements for a direct overlay of material on three-dimensional objects. Whether incorporated in the original equipment manufacturing process, or provided as a retrofitting solution, the material, in one embodiment, may enable military vehicles to change their radar cross-section from a high value during peacetime activity to a low value in combat situations. The material may also cover any and all potential objects that may act as an antenna in a combat situation. The FSS component of the RAM may further determine which specific frequencies may be transmitted and/or blocked.

Very-large-scale integration (VLSI) is the process of creating integrated circuits by combining thousands of transistors into a single chip. VLSI began in the 1970s when complex semiconductor and communication technologies were being developed. For example, a microprocessor is a VLSI device. As microprocessors become more complex due to technology scaling, microprocessor designers have encountered several challenges which force them to think beyond the design plane, and look ahead to post-silicon. Increasingly, electromagnetic compatibility (EMC) and EMI have become a major problem for circuit designers, and it is likely to become more severe in the future. The common use of VLSI technology, utilization of higher frequencies and component miniaturization combine to increase the probability of interference on all electronic assembly levels. These same technology pressures apply to the VLSI device causing electromagnetic interference problems in the die of the VLSI thereby affecting the whole system.

Significantly impacting the radical miniaturization of VLSI devices is nanoelectromechanical systems (NEMS). NEMS are devices that may integrate electrical and mechanical functionality on the nanoscale. NEMS form the logical next miniaturization step from so-called microelectromechanical systems (MEMS).

The level of advancement in electronic packaging is lagging behind the advancements in MEMS and NEMS technology. This is largely due to the multi-disciplinary field of electronics packaging, which may incorporate several of the traditional sub-areas of mechanics, electronics, physics and chemistry. The most prominent of these areas may include heat transfer, materials, signal transmission, mechanical analysis and manufacturing.

In accordance with one embodiment, a method for electromagnetic interference and thermal management of VLSI devices may be implemented. This method may deploy a combination of magnetic resonant frequency absorber materials, mismatched dielectric binders, miniaturized frequency selective surface (FSS) technology and thermally conductive carbon. For example, in one embodiment, a polymer heat sink having electromagnetic absorptive and thermal dissipative properties is configured so as to mount to the heat sink base element of VLSI, multichip modules (MCM) and hybrid integrated circuit (HIC) housing designs. Utilizing the unique thermally conductive characteristics of carbon, in addition to the electromagnetic absorptive properties of the same material, may be called upon to provide thermal and EMI management in a single package. Controlling the aspect ratio of carbon nano tubes, rods, flakes, and the like, these "fillers" may be combined with a polymer binder having a specific dielectric that best supports the targeted frequency. The individual nano-scale carbon particles may or may not have an insulative coating.

All-polymer construction may also be used that may serve the double duty of thermal dissipation and EMI absorption. In this embodiment, a polymer matrix having high thermal dissipative properties may be used in conjunction with an all-dielectric metamaterial absorber.

The highly loaded polymer may then be extruded and die cut to form miniature cylinders. The cylinders may be designed to have a specific aspect ratio. These highly loaded cylinders may effectively attenuate electromagnetic signals on a broad band. At loadings in the 80% by weight range, there may be a sufficient concentration of carbon to allow for significant thermal conductivity.

In another embodiment, high permeability filler particles having a predetermined aspect ratio may be coated with a suitable insulator. These insulated particles may be compounded with specific dielectric binders that best support the targeted frequency. The highly loaded (approximately 80%) compounded material may then be used, for example, to form thin magnetic resonant frequency absorbers that are integrated with existing integrated circuit housings or in metamaterial that may become a thermally or vacuum formed skin that may be incorporated into the insertion molding process or as a compounded absorber material used in a multi-material injection molding injection. The thin absorber sheets may be directly applied to heatsink bodies, or may be more precisely designed to be located at a specific distance from the die emissions.

In another embodiment, deployment of the magnetic resonant frequency absorber material may be performed via "insert injection molding" processes or as a single step injection molding process.

In another embodiment, multiple technologies may be combined to enable the manufacturing of a three-dimensional device/component that is designed to block and/or transmit electromagnetic frequencies of choice. There are three specific technologies deployed: 1) a magnetic resonant frequency absorber, 2) a frequency selective surface (FSS), and 3) direct write assembly (conductive inks).

In one embodiment, magnetic resonant frequency absorbers may operate via phase cancellation. The incoming wave incident upon the absorbing material is partially reflected and partially transmitted. The transmitted portion undergoes multiple internal reflections to give rise to a series of emergent waves. At the design frequency, the sum of the emergent waves is equal in amplitude to (by 180 degrees out of phase with) the initial reflection portion. In theory, zero reflection takes place at the design frequency. In practice, absorption of greater than 30 dB may be achieved.

Distributed magnetic fillers suspended in a flexible elastomeric matrix is the most common form of resonant frequency absorber material. By increasing the permeability and permittivity of the elastomer, the refractive index is also increased, thus allowing for a thinner material. Based on the principle of phase cancellation, the lower the frequency to be attenuated, the thicker the material must be.

In another embodiment, FSS may be implemented. Since natural materials exhibit very weak coupling through the magnetic component of the electromagnetic wave, artificial materials that exhibit a strong magnetic coupling are being researched and fabricated. These artificial materials are known as metamaterials.

Electromagnetic metamaterials may be viewed as structured composites with patterned metallic subwavelength inclusions. As mesoscopic physical systems, these are built starting from the unit cell level. These unit cells are designed to yield prescribed electromagnetic properties. A characteristic of this type of metamaterial is that the individual components have a resonant (coupling) response to the electric, magnetic or both components of the electromagnetic radiation of the source. The EM metamaterial as an artificially designed transmission medium, has so far delivered desired responses at frequencies from the microwave through to the near visible.

Frequency selective surfaces may be fabricated as planar two-dimensional periodic arrays of metallic elements with specific geometrical shapes, or may be periodic apertures in a metallic screen. The transmission and reflection coefficients for these surfaces are dependent on the frequency of operation and may also depend on the polarization and the angle of the transmitted electromagnetic wave striking the material or angle of incidence. The versatility of these structures are shown when having frequency bands at which a given FSS is completely opaque (stop-bands) and other bands at which the same surface allows wave transmission.

When the FSS is engineered for electromagnetic band gap (EBG) characteristics, the FSS may be designed to enlarge its stop band properties in relation to dispersive, surface wave (SW) frequencies, (microwave and radio frequencies). Furthermore, the FFS is designed for EBG to reduce its dependence on the propagating direction of the surface wave traveling across the surface (interface).

In accordance with one embodiment, a method for manufacturing planar substrates and three-dimensional devices/components whose properties allow the device/components to block and/or transmit desired electromagnetic frequencies.

In the planar or a two-dimensional form factor, frequency-specific FSS material may be used as a single absorber element (Salisbury screen) or as a stacked array type absorber (Jaumann). The periodically arranged specific unit cell patterns of the FSS material selectively allow the transmission or reflection of desired frequencies.

The FSS cell patterns may be produced through multiple methods, such as electro-deposition, electroless-deposition, photo-imagable conductive polymers and conductive inks that are screen printed, laser jet or "direct-write" printed. The dielectric of the material, upon which the FSS cell pattern is made, is chosen to facilitate maximum attenuation for the frequency or frequencies of concern. The FSS material (depending on the degree of stacked-arrays) may be of any thickness. This material may be produced in roll form to facilitate additional processing of the FSS material.

The FSS roll material may then be coated with a magnetic resonant frequency absorber that may have narrow or broad band absorption characteristics. The coating of the FSS material is done via knife over roll processing and handled on a roll to roll production line. Consecutive thin coatings are made to deliver the final desired thickness. Additionally, the knife over roll production method, by virtue of the hydraulics that are inherent to the process, facilitates an alignment of the magnetically resonant fillers that is critical to final absorption characteristics. The planar sheet material is ideally suited to multilayer printed circuit design and processing.

In a 3 dimensional device/component deployment of known metametal properties are combined with known magnetic resonant frequency absorber technology.

One approach is to create a vacuum and or thermally formed FSS skin that is inserted into the injection mold. The mold is then filled with a specifically tuned magnetic resonant frequency absorber material.

It is also possible to injection mold a magnetic resonant frequency component and apply the FSS pattern via "direct write" technology. This technology is capable of printing conductive inks on three dimensional objects via a computer-controlled 3-axis translation stage.

Components deploying combined MRF and FSS technologies allow and facilitate the transmission of discreet frequencies while simultaneously suppressing others.

It should also be noted that in an injection molding component, magnetic resonant frequency fillers (high permeability material) will be randomly dispersed as a result of the injection molding process. Alignment of flake, which promotes improved performance, will not be possible. In this application it may be more desirable to deploy high permeability filler that exhibit alternative geometries. Rods and spheres are two alternative geometries. These geometries may favor base materials other than permalloy. Chromium dioxide is a good example of a high permeability material that works exceptionally well when deployed as nano-scale rods.

In one embodiment, a number of "nano-dimensional" thin film processes may be utilized that include, but are not limited to, electroless deposition, atomic sputtering, sputter etching, spin coating, vapor deposition and electrospray deposition in order to produce frequency specific, multi-band and broad band core laminates to be used in multilayer PCB construction.

Grounding and shielding are techniques aimed to reduce emissions or divert EMI away from a "victim receptor" by providing an alternative, low-impedance path. For example, shielded housings may typically be manufactured in sections, such as a box and lid. An RF gasket may be used at the section joints to reduce the amount of interference that leaks through the joint. Shielded cables, where the conducting wires are surrounded by an outer conductive layer that is grounded at one or both ends, may be used. Grounding or earthing schemes, such as star earthing for audio equipment or ground planes for radio frequency (RF), may be used.

Other general measures may include, but are not limited to, decoupling or filtering at critical points such as cable entries and high-speed switches, using RF chokes and/or RC elements, transmission line techniques for cables and wiring, such as balanced differential signal and return paths, and impedance matching, and avoidance of antenna structures, such as loops of circulating current, resonant mechanical structures, unbalanced cable impedances or poorly grounded shielding.

Despite best efforts to reduce EMI through good PCB design, electromagnetic radiation may still require management that is external to the physical PCB. All time-varying currents in a system, whether intended or not, may radiate. It is easier to regard EMI in terms of current and frequency, as opposed to voltage and time. Current may radiate more efficiently at higher frequencies, and small currents may cause more radiation than large currents. As an example, noise currents induced on cables that are very small may exhibit significant radiation due to the cable's ability to act as an efficient antenna. Similarly, noise induced through hole connections to the PCB's ground plane may be disseminated to the perimeter edge of the PCB, which acts as an effective antenna. PCB EMI is a large contributing source to system-level EMI.

Of the many EMI mechanisms, PCB EMI may be dominated by differential mode (DM) radiation, while system-level EMI may be dominated by common mode (CM) radiation. DM radiation may result from signal and return current pairs, which may be physically close to each other. These differential currents may be large, but the phase cancellation effect may significantly reduce the radiated field strength. CM radiation may result from noise currents leaking out onto cables. These currents may be small, but the return path to the source may be huge, resulting in a large loop area and radiation.

In the lower frequency range, it is not uncommon that CM currents on cables, although smaller than DM currents on a PCB, may radiate more because the product of the cable length and wavelength is typically several orders of magnitude larger than the DM loop area. At higher frequencies, DM radiation may become more important because it is proportional to the square of the frequency while CM radiation is proportional to the frequency.

In both DM and CM, the controllable variables are current and the antenna dimensions. With the advent of higher speed and higher frequency designs, designers are forced to review EMI concerns on a component, PCB, enclosure and system level. EMI resulting from components, modules and digital circuitry on a PCB level may establish a coupling path between the radiation source and unshielded systems/components in the vicinity of the radiation source. The coupling path may take a variety of forms. For example, the coupling path may comprise an electromagnetic or inductive coupling between the electromagnetic radiation source and the ground plane or conductor of the PCB. In this example, the perimeter edge of the PCB may act as an antenna. Such radiation may produce various undesirable effects. Unchecked electromagnetic emissions may interfere with, and significantly impair the operation and integrity of unshielded components, modules and systems in the vicinity of the radiating source.

The emitted radiation may be confined in order to reduce the attendant EMI. Confinement of EMI may be achieved to some extent by enclosing the system in a grounded conductive enclosure, and by restricting the size of any openings on the exterior of the enclosure so as to reduce the escape of electromagnetic radiation. This approach may be viewed as a "reflective" solution. Reflective techniques for confining EMI simply divert the problem from one location to another within the system environment. There may be multiple reflective approaches deployed in a system in order to maintain electronic functionality. Unfortunately, a shielding/confinement approach to dealing with EMI places a burden on the design of the enclosure.

Absorptive technologies may eliminate the need to shield and confine EMI by converting an electromagnetic signal into heat. While EMI may cause high amounts of electrical interference, when converted to heat energy, the residual heat may be easily managed. Accordingly, in accordance with the embodiments described herein, absorptive materials are desirable for EMI management.

EMI absorbing materials may be optimized for electrical performance. The electric or magnetic properties of these materials may be altered to allow absorption of RF and microwave energy. In magnetically loaded materials, fillers such as ferrites, iron, and unique alloys, may increase the permeability of the base materials. RF absorbers and microwave absorbers generally are either considered magnetic resonant frequency absorbers or graded dielectric materials.

Magnetic resonant frequency absorbing materials may be designed to absorb energy either a single discrete frequency or at multiple frequencies. By controlling the critical magnetic and dielectric loading and thickness of each of the layers, multiple frequencies may be accommodated.

Magnetic resonant frequency absorbers operate through phase cancellation. The incoming wave incident upon the absorbing material is partially reflected and partially transmitted. The transmitted portion undergoes multiple internal reflections to give rise to a series of emergent waves. At the design frequency, the sum of the emergent waves is equal in amplitude to the initial reflection portion. Distributed magnetic fillers suspended in a flexible elastomeric matrix is the most common form of resonant frequency absorbing material. Based on the principle of phase cancellation, the lower the frequency to be attenuated, the thicker the material must be.

In one embodiment, EMI absorbing material may be shaped into a desired form factor using an extrusion process. For example, a PCB card guide may be designed to address issues relating to the electromagnetic radiation emitted from the PCB. The PCB card guide may have various EMI absorptive properties. When a PCB card is inserted into a computer system for engagement with a connector, a significant degree of guidance may be required in order to ensure that the connector is properly seated. PCB card cages are typically designed using a framework that provides a card receiving region in which pairs of card guides establish locations for insertion of "daughter" PCB cards. The leading edge of these daughter PCB cards have finger tabs that require a registered mating to the corresponding connectors of the backplane traversing the rear of the card receiving region. The backplane may provide for electrical connection of the circuits of each daughter card inserted to circuits of other daughter cards as desired or to conductors of the input/output cable.

The PCB card guide may be formed out of an EMI absorptive material that prevents EMI emitted by a PCB card inserted into the PCB card guide from interfering with components outside of the PCB card guide by absorbing electromagnetic signals emitted from the PCB card and transforming the signals into heat. The EMI absorptive material may include magnetic resonant frequency absorbing materials.

Alternatively, "absorber cans" made out of the same EMI absorptive material may be attached over a problematic component or circuit of the PCB card to contain electromagnetic signals emitted from the component or circuit.

In accordance with one embodiment, the EMI absorptive material may be formed using an extrusion procedure in which a non-conductive material (e.g., plastic, polymer material, and the like) is melted down, and a metallic medium (e.g., metal flakes) is applied throughout the melted material before being molded and cooled into a final product.

Methods of manufacturing EMI absorbing material are also disclosed herein. A manufacturing process that ensures maintenance of the desired orientation may be chosen in order to maintain a desired orientation of the metallic aggregate in a three dimensional finished product and is disclosed herein. In order to maintain a stratified, horizontal layering of metallic flake in a polymer binder, any number of coating processes may be utilized. All of these coating processes may yield a flat sheet formed product.

Absorptive card guides may be extruded or molded. The card guide may include a metal component for structural shielding, structural rigidity or grounding purposes.

Typical manufacturing processes for making three dimensional product, injection molding, extrusion molding and casting, will yield a product with random dispersement of the metallic medium.

By choosing a polymer that is suited to forming EMI absorbing product, the product having a properly oriented metallic filler may then be used in the forming process to make custom three dimensional product having high EMI absorption properties.

The composite material of the absorptive card guide body may include a plastic/polymer selected from a group including but not limited to Acrylonitrile Butadiene Styrene (ABS), Polycarbonate (PC), PC/ABS, Polypropylene (PP), Nylon (PA), Styrene Acrylonitrile (SAN), Polysulfone (PSU), Polybutylene Terephthalate (PBT), Polyethylene Terephthalate (PET), Polyphenylene Sulfide (PPS), Polyimides (PI), Polyester Thermoplastic Elastomer (TPE), Acrylic (PMMA), Rigid Thermoplastic Polyurethane (RTPU), Liquid Crystal ZPloymer (LCP), Phenolics, Polyvinyl Chloride (PVC), Styrenics, Cured Polyester and epoxy resins, rubber, silicone RTV, and other elastomers or any other similar thermoplastic, thermoset, or room temperature curing plastics or mixtures thereof.

Metal utilized as magnetically permeable fillers may be selected from a group including but not limited to nickel, copper, iron, silver, gold, tin, zinc, lead, aluminum, brass, bronze, stainless steel, molybdenum and any mixture thereof and any other electrically conductive metal.

High permeability metals may be used in the construction of EMI absorbers. The geometry of the metallic aggregate may greatly influence the EMI absorptive properties. Flake, platelet, spherical and rod shaped geometries may be used to improve the permeability of the final product. The orientation of the chosen geometry within the polymeric binder may also be an influencing factor for EMI absorption performance.

For example, the metallic aggregate may use two different types of flakes added into the polymeric binder. The inherent properties of these flakes may allow absorption of EMI signals at multiple frequencies. In a cell phone enclosure, for example, that may require configuring ("tuning") the configuration of the metallic aggregate using phase cancellation techniques to absorb EMI signals at broad and/or narrow bands, (e.g., a long term evolution (LTE) band and an IEEE 802.11n band).

Metamaterials may also exhibit negative permittivity and negative permeability depending on the configuration of the material. Two approaches to achieve these conditions include the split ring resonator (SRR) and the Electromagnetic Band Gap (EBG). The EBG approach is targeted at an absorber application, such as absorbing EMI that is present in a helicopter.

The SRR technology was originally targeted at the development of filters that allowed certain frequencies to be passed by the metamaterial. From the point of view of this project what is more interesting is the concept of the "Complementary Split Ring Resonator" ("CSRR"). Where the SRR generates a resonant cavity by printing a "split ring" circuit on a medium, the CSRR generates a resonant cavity by printing everything BUT the SRR pattern. In other words, the CSRR can be viewed as a metallic "pad" where the actual resonant cavity pattern is NOT metalized. The effect of this is that resonant absorber is created, with the added feature of a very wide frequency response.

Fishnet structure and fractal elements may also be included as the primitives for generating CSRRs. Interestingly, one of the first applications of the CSRR was to put the absorber in the power plane of a PCB. This arrangement minimizes the additional circuitry and cost associated with putting high efficiency EMI absorber into electronic devices.

Figure 3:
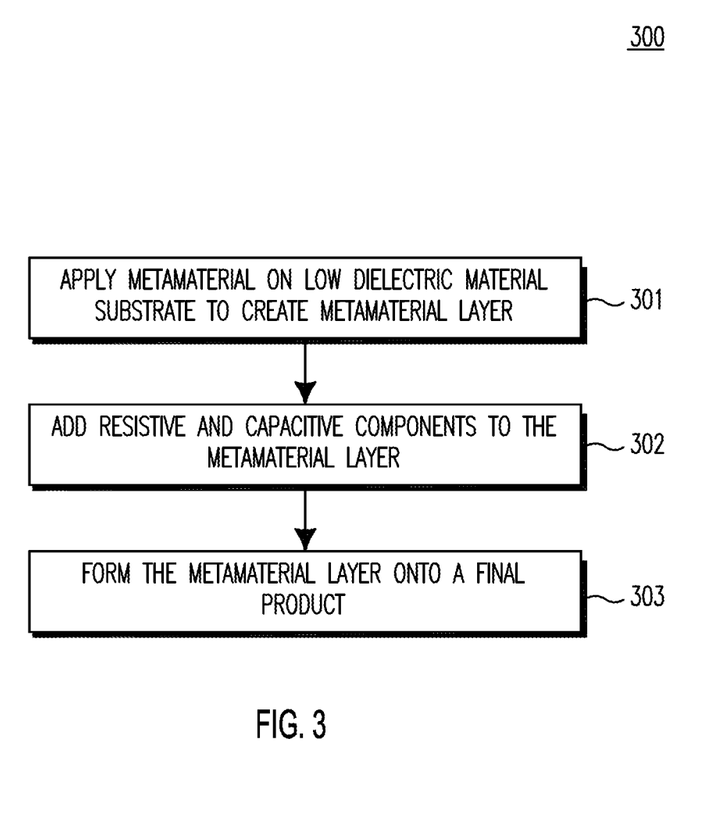
FIG. 3 is a flow chart of an example process applying the concept of utilizing unique properties of manufactured metamaterials as absorbers to skins, printed circuit boards (PCBs), cables, and cases for electronic equipment (either industrial, military, or consumer).

FIG. 3 is a flow chart of an example process 300 applying the concept of utilizing unique properties of manufactured metamaterials as absorbers to skins, PCBs, cables, and cases for electronic equipment (either industrial, military, or consumer) to create a RFA or PMA to absorb frequencies in a targeted frequency range such as the microwave frequency range. Applying a special case of metamaterials, known as negative-index metamaterials (in particular Double Negative Medium or DNG), to the specific problem of EMI absorption in products manufactured in the electronics and aerospace industries. Utilizing these materials, near perfect absorption may be attained at various frequencies and may be done so with materials that are significantly thinner than commonly used absorber products, such as loaded sheet elastomers, or various foams. In the example of FIG. 3, the metamaterial is applied on a low dielectric material substrate to create a metamaterial layer 301. Resistive and capacitive components may then be added to the metamaterial layer 302. The metamaterial layer may then be formed into a final product 303 such as a PCB, shrinkable tubing for interconnection cable manufacturing, an overmold for case manufacturing, or an absorber skin.

The performance is not obtained from the combination of specific materials chosen in manufacture, but rather in the way that the chosen materials are manufactured. One example is a sheet with a periodic pattern of conductive material imprinted on it via lithographic/printed-circuit methodology or other means. The pattern may be made up of individual cells with certain characteristics. The way the cell is designed such as its width, thickness, and shape, and the subsequent pattern it is a part of, may come together to give the material in the aggregate a particular performance beneficial to certain problem sets.

The specific application of the process described in the example of FIG. 3 is for the manufacture of metamaterial absorbers in such a way that they may be included as a layer in (1) standard printed circuit board form factors, (2) shrinkable tubing used in interconnection cable manufacturing, and (3) overmold material used in case manufacturing. The objective is that EMI mitigation may be designed into a product from the beginning of its design, and may become part of the finished part, via a layer (or layers) in the PCB, cabling, or case for the product.

The ability of a particular material to achieve absorption qualities may be closely related to its level of electrical permittivity and magnetic permeability. Traditional absorber products have utilized various natural substances, such as iron and nickel, in a largely heuristic process to find the right combination of permittivity, permeability, thickness, manufacturability, and cost-effectiveness to meet a particular market need.

Negative index metamaterials, on the other hand, may be designed from the outset to achieve certain characteristics of negative permittivity and permeability and thus designed with a resulting absorption. They may be tailor-made to absorb one or more frequencies, achieving near perfect absorption.

The ability of a metamaterial cell to deal with EMI may be related to the targeted wavelengths. That is, the size of the cells may be dependent on the wavelength selected for absorption, but may be much less than the wavelength of the incident radiation (~10-100). Because microwaves generally have wavelengths in the mm-range (e.g 2.4 GHz or 125 mm), the individual metamaterial cells may be much smaller (~1 mm). However, they may be much thinner, sometimes achieving a thinness of about 75 times less than the wavelength. As the width and length of these cells may be in the mm range, and the thickness much less than that, they are very suitable to be deposited onto standard PCB substrates, such as FR4, or other materials that can be used as conformal skins for 3-dimensional products (e.g. cellphones, communications boxes, etc.).

Metamaterials have historically consisted of FSS as described above that are printed on a substrate. They may be characterized by a periodic pattern implemented as a screen or metallic particles on a dielectric surface.

An FSS based metamaterial may employ a (miniature) model of equivalent LC circuitry. An LC circuit, also called a resonant circuit, tank circuit, or tuned circuit, consists of an inductor and a capacitor. When connected together, they can act as an electrical resonator, (an electrical analogue of a tuning fork) storing energy oscillating at the circuit's resonant frequency. LC circuits are used either for generating signals at a particular frequency, or picking out a signal at a particular frequency from a more complex signal. They are key components in many electronic devices, particularly radio equipment, used in circuits such as oscillators, filters, tuners and frequency mixers.

Microwave absorbers based on FSS have unwanted side effects that mitigate their usefulness. However, metamaterials have been shown to be perfect absorbers in the microwave (i.e. Gigahertz) frequency spectrum, particularly using combinations of Split Ring Resonators (SRR) and Electrically Coupled LC Resonators (ELC). These materials have been applied in the optical frequency region the Gigahertz microwave frequency spectrum. A perfect absorber with a broad response may be built using circuits on a FR4 substrate, and described herein are methods to use metamaterials to create embodiments that allow perfect microwave absorbers (PMA) to be utilized to make numerous products.

PMA skins may be created in accordance with one embodiment using the example process of FIG. 3. In this embodiment the SRRs and ELCs may be printed on a low dielectric material, using the Gravure method. The preferred low dielectric constant material may be a flexible, thermosetting material. In one form of the embodiment, the SRRs may be printed on one side of the material, using standard techniques to provide registration marks for subsequent steps. A subsequent step may add the required resistive and capacitive components to the SRR, also using the Gravure method. The ELCs may also be printed using the Gravure method, in a manner similar to that described for the SRRs. The layers used to make the PMA may be on the order of 10 microns leading to extremely thin sandwiches that may be used as skins that may be formed either into cavities in the product or on the outer surface of the product. The thickness of the material may be greater than or less than 10 microns. The PMA may be as thin as 2 layers, although the final absorber material may have more layers. Additional layers, with different resonant frequencies and bandwidth can also be made using this method.

In one embodiment the skins may be registered, using the registration marks that were applied during the Gravure process used to make the layers in the skin and formed on the final product in one step.

In another embodiment the layers may be registered, using the registration marks that were applied during the Gravure process used to make the layers and mechanically fastened into a complete skin package prior to being formed on the final product.

In yet another embodiment the layers may be registered, using the registration marks that were applied during the Gravure process used to make the layers and thermoformed into a complete skin package prior to being formed on the final product.

In yet another embodiment the SRRs and ELCs, together with their resistive and capacitive elements, may be printed on a low dielectric material using the pad print method. The preferred low dielectric constant material may be a flexible, thermosetting material. In one form of the embodiment, the SRRs may be printed on one side of the material, using standard techniques to provide registration marks for subsequent steps. A subsequent step may add the required resistive and capacitive components to the SRR, also using the pad print method. The ELCs may also be printed using the pad print method in a manner similar to that described for the SRRs. The layers may be used to make the PMA may be on the order of 10 microns leading to extremely thin sandwiches that may be used as skins that may be formed either into cavities in the product or on the outer surface of the product. The thickness of the material may be greater than or less than 10 microns. The PMA may be as thin as 2 layers, although the final absorber material may have more layers. Additional layers, with different resonant frequencies and bandwidth may also be made using this method.

In one embodiment the skins may be registered using the registration marks that were applied during the pad print process used to make the layers in the skin and formed on the final product in one step.

In another embodiment the layers may be registered, using the registration marks that were applied during the pad print process used to make the layers and mechanically fastened into a complete skin package prior to being formed on the final product.

In yet another embodiment the layers may be registered, using the registration marks that were applied during the pad print process used to make the layers and thermoformed into a complete skin package prior to being formed on the final product.

Direct-write assembly is a 1-to-3D printing technique that may enable the fabrication of features ranging from simple lines to complex structures by the deposition of concentrated inks through fine nozzles (~0.1-250 μm). This printing method may comprise a computer-controlled 3-axis translation stage, an ink reservoir and nozzle, and a 10× telescopic lens for visualization. Unlike inkjet printing, a droplet-based process, direct-write assembly may involve the extrusion of ink filaments either in or out-of-plane. The printed filaments may conform to the nozzle size. Hence, microscale features (<1 μm) may be patterned and assembled into larger arrays and multidimensional architectures.

Although direct-write processes may be preferable for the applications outlined, dip-pen nanolithography (DPN) and e-jet printing and all other processes for printing conductive ink become potential means by which an SRR and ELC patterns are produced.

In another embodiment the SRRs and ELCs, together with their resistive and capacitive elements, may be printed on a low dielectric material using the Direct Write, DPN or e-jet method. The preferred low dielectric constant material may be a flexible, thermosetting material. In one form of the embodiment, the SRRs may be printed on one side of the material, using standard techniques to provide registration marks for subsequent steps. A subsequent step may add the required resistive and capacitive components to the SRR, also using the Direct Write, DPN or e-jet method. The ELCs may also be printed using the Direct Write, DPN or e-jet method, in a manner similar to that described for the SRRs. The layers used to make the PMA may be on the order of 10 microns leading to extremely thin sandwiches that may be used as skins that are formed either into cavities in the product or on the outer surface of the product. The thickness of the material may be greater than or less than 10 microns. The PMA may be as thin as 2 layers, although the final absorber material may have more layers. Additional layers, with different resonant frequencies and bandwidth can also be made using this method.

In one embodiment the skins may be registered, using the registration marks that were applied during the Direct Write, DPN or e-jet method process used to make the layers in the skin and formed on the final product in one step.

In another embodiment the layers may be registered, using the registration marks that were applied during Direct Write, DPN or e-jet method process used to make the layers, and mechanically fastened into a complete skin package prior to being formed on the final product.

In yet another embodiment the layers may be registered, using the registration marks that were applied during the Direct Write, DPN or e-jet method process used to make the layers, and thermoformed into a complete skin package prior to being formed on the final product.

All the above specified embodiments use an additive process, allowing components (i.e. metallic patterns, resistors, capacitors, etc.) to be selected for their efficacy in producing a PMA with the desired frequency response and bandwidth. This is in contrast to most methods of producing absorptive material that rely on a subtractive process to remove unwanted material from the substrate.

Any printing methodology that is capable of depositing the material to form the SRRs, ELCs, and their respective resistive and capacitive elements may be as applicable to creating a PMA as those described above. Various geometries printed to create the PMA may be chosen. Building a PMA sandwich may be done using any means (chemical bonding, etc.) that allows the sandwich to be mechanically or thermally formed for use with the final product. Such means may be to form two separate cases using different processes and then mating them using mechanical, chemical, or thermal processes.

PMA PCBs may be created in accordance with another embodiment using the example process of FIG. 3. In one embodiment the SRRs and ELCs may be printed on a low dielectric material, using the Gravure method. The preferred low dielectric constant material may be a standard PCB substrate, such as a thin layer of FR4. In one form of the embodiment, the SRRs may be printed on one side of the material, using standard techniques to provide registration marks for subsequent steps. A subsequent step may add the required resistive and capacitive components to the SRR, also using the Gravure method. The ELCs may also be printed using the Gravure method, in a manner similar to that described for the SRRs. The layers used to make the PMA may be on the order of 10 microns leading to extremely thin sandwiches that are used as layers in making the PCB. The thickness of the material may be greater than or less than 10 microns. The PMA may be as thin as 2 layers, although the final absorber material may have more layers. Additional layers, with different resonant frequencies and bandwidth may also be made using this method.

In one embodiment the layers may be registered, using the registration marks that were applied during the Gravure process used to make the layers and formed into the final product in one step.

In another embodiment the layers may be registered, using the registration marks that were applied during the Gravure process used to make the layers and mechanically fastened into a complete layer package prior to being formed into the final product.

In yet another embodiment the layers may be registered, using the registration marks that were applied during the Gravure process used to make the layers and thermoformed into a complete layer package prior to being formed into the final product.

In another embodiment the SRRs and ELCs, together with their resistive and capacitive elements, may be printed on a low dielectric material using the pad print method. The preferred low dielectric constant material may be a standard PCB substrate, such as a thin layer of FR4. In one form of the embodiment, the SRRs may be printed on one side of the material, using standard techniques to provide registration marks for subsequent steps. A subsequent step may add the required resistive and capacitive components to the SRR, also using the pad print method. The ELCs may also be printed using the pad print method, in a manner similar to that described for the SRRs. The layers used to make the PMA may be on the order of 10 microns leading to extremely thin sandwiches that may be used as layers in making the PCB. The thickness of the material may be greater than or less than 10 microns. The PMA may be as thin as 2 layers, although the final absorber material may have more layers. Additional layers, with different resonant frequencies and bandwidth can also be made using this method.

In one embodiment the layers may be registered, using the registration marks that were applied during the Pad Print process used to make the layers and formed into the final product in one step.

In another embodiment the layers may be registered, using the registration marks that were applied during the Pad Print process used to make the layers and mechanically fastened into a complete layer package prior to being formed into the final product.

In another embodiment the layers may be registered, using the registration marks that were applied during the Pad Print process used to make the layers and thermoformed into a complete layer package prior to being formed into the final product.

Direct-write assembly is a 1-to-3D printing technique that enables the fabrication of features ranging from simple lines to complex structures by the deposition of concentrated inks through fine nozzles (~0.1-250 μm). This printing method may comprise a computer-controlled 3-axis translation stage, an ink reservoir and nozzle, and 10× telescopic lens for visualization. Unlike inkjet printing, a droplet-based process, direct-write assembly may involve the extrusion of ink filaments either in or out-of-plane. The printed filaments may conform to the nozzle size. Hence, microscale features (<1 μm) may be patterned and assembled into larger arrays and multidimensional architectures.

Although direct-write processes may be preferable for the applications outlined, dip-pen nanolithography (DPN) and e-jet printing and all other processes for printing conductive ink become potential means by which an SRR and ELC patterns are produced.

In another embodiment the SRRs and ELCs, together with their resistive and capacitive elements, may be printed on a low dielectric material using the Direct Write, DPN or e-jet method. The preferred low dielectric constant material may be a standard PCB substrate, such as FR4. In one form of the embodiment, the SRRs may be printed on one side of the material, using standard techniques to provide registration marks for subsequent steps. A subsequent step may add the required resistive and capacitive components to the SRR, also using the Direct Write, DPN or e-jet method. The ELCs may also be printed using the Direct Write, DPN or e-jet method, in a manner similar to that described for the SRRs. The layers used to make the PMA may be on the order of 10 microns leading to extremely thin sandwiches that may be used as layers in making the PCB. The thickness of the material may be greater than or less than 10 microns. The PMA may be as thin as 2 layers, although the final absorber material may have more layers. Additional layers, with different resonant frequencies and bandwidth may also be made using this method.

In one embodiment the skins may be registered, using the registration marks that were applied during the Direct Write, DPN or e-jet method process used to make the layers in the skin and formed on the final product in one step.

In another embodiment the layers may be registered, using the registration marks that were applied during Direct Write, DPN or e-jet method process used to make the layers and mechanically fastened into a complete skin package prior to being formed into the final product.

In another embodiment the layers may be registered, using the registration marks that were applied during the Direct Write, DPN or e-jet method process used to make the layers and thermoformed into a complete skin package prior to being formed into the final product.

All the above specified embodiments use an additive process, allowing components (i.e. metallic patterns, resistors, capacitors, etc.) to be selected for their efficacy in producing a PMA with the desired frequency response and bandwidth. This is in contrast to most methods of producing absorptive material that rely on a subtractive process to remove unwanted material from the substrate.

Any printing methodology that is capable of depositing the material to form the SRRs, ELCs, and their respective resistive and capacitive elements may be as applicable to creating a PMA as those described above. Various geometries printed to create the PMA may be chosen. Building a PMA sandwich may be done using any means (chemical bonding, etc.) that allows the sandwich to be mechanically or thermally formed for use with the final product. Such means may be to form two separate cases using different processes and then mating them using mechanical, chemical, or thermal processes.

The processes for producing either skins for products or sandwich material for PCBs may also be used to make tuned signal containment materials. In this case the PMA layer may be applied either as a surface skin or inserted as a layer in a multi-layer sandwich of construction materials (e.g. a layer in a wall insulation).

An example of where this may be applied is a hospital environment. Used in wall construction materials, WiFi signals that are part of the hospital communications infrastructure may be allowed to operate while visitors' cell phone signals may be suppressed.

An alternative metamaterial may include using only dielectric materials to produce the absorber characteristics. All dielectric metamaterials may be characterized by having: (1) A low dielectric constant matrix that the other components are dispersed in (2) two components that have dielectric constants greater than the dielectric constant of the matrix (typically at least two orders of magnitude higher). Beyond that there are two specific material configurations that may be used to create all dielectric metamaterials:

(1) Two spheres, where the spheres have differing dielectric constants ($\varepsilon_1 < \varepsilon_2$)

(2) Two spheres, where the spheres have the same dielectric constant, but differ in their radii (r1<r2)

Other geometries may be used in place of the spheres to achieve the same effect.

In one embodiment, the spheres may be mixed in a semi-solid matrix material to disperse the spheres uniformly within the matrix. In this embodiment, the semi-solid matrix may be capable of being molded into a skin for a final product.

The metamaterial skin may then be attached to the final product through mechanical or chemical means.

In another embodiment, the spheres may be mixed in a semi-solid matrix material to disperse the spheres uniformly with the matrix. In this embodiment, the matrix may be capable of being thermo-formed as an overmold to connectors on cables.

In another embodiment, the spheres may be mixed in a semi-solid matrix material to disperse the spheres uniformly with the matrix. In this embodiment, the matrix may be capable of being extruded to form cable sheaths that are thermoset around a cable.

In another embodiment, the spheres may be mixed in a semi-solid matrix to disperse the spheres uniformly within the matrix. In this embodiment the matrix may be capable of being formed into an electromagnetic absorber sheet that may be incorporated as a layer into planar products. Such planar products include materials such as wall coverings that may be used in EMI sensitive applications such as hospitals or data centers. The planar products may be constructed so as to allow WiFi signals to pass through the planar covering, while blocking cell phone signals.

One of the key characteristics of the spheres embedded into a matrix is that the packing or load factor may be a key determinant of the ability to create a metamaterial. The packing required for a metamaterial may be approximately 4× the radius of the sphere.

The all dielectric material absorbers may be designed to block a narrow bandwidth of EMI signals. Alternatively, it may be possible to construct materials that may be used in layers to provide a broadband response around a central frequency.

Although features and elements are described above in particular combinations, one of ordinary skill in the art will appreciate that each feature or element can be used alone or in any combination with the other features and elements. The methods and features described above may be performed using any appropriate architecture and/or computing environment. The apparatuses above may be controlled using any appropriate architecture and/or computing environment to perform a method herein. Although features and elements are described above in particular combinations, each feature or element can be used alone or in any combination with or without the other features and elements.

The references cited throughout this application are incorporated for all purposes apparent herein and in the references themselves as if each reference was fully set forth. For the sake of presentation, specific ones of these references are cited at particular locations herein. A citation of a reference at a particular location indicates a manner(s) in which the teachings of the reference are incorporated. However, a citation of a reference at a particular location does not limit the manner in which all of the teachings of the cited reference are incorporated for all purposes.

It is understood, therefore, that this disclosure is not limited to the particular embodiments disclosed, but is intended to cover all modifications which are within the spirit and scope of this disclosure as defined by the appended claims; the above description; and/or shown in the attached drawings.

What is claimed is:

1. A method for producing a radio frequency absorbing (RFA) printed circuit board (PCB), the method comprising:
   applying a metamaterial to a substrate to create a metamaterial layer with an aspect ratio that provides attenuation in a targeted frequency range, wherein the metamaterial is constructed of spheres of a first dielectric constant and spheres of a second dielectric constant, wherein the spheres of the first dielectric constant and the spheres of the second dielectric constant are of a size based on a wavelength size of a frequency in the targeted frequency range, are dispersed uniformly in a semi-solid matrix formed into an electromagnetic absorber sheet, and have a packing density of four times the radius of the spheres; and
   forming the metamaterial layer into a multi-layered PCB assembly for absorption of electromagnetic radiation in targeted frequency range.

2. The method of claim 1, wherein Gravure printing is used to apply the metamaterial to the substrate.

3. The method of claim 1, wherein pad printing is used to apply the metamaterial to the substrate.

4. The method of claim 1, wherein Direct Write, dip-pen nanolithography (DPN) or e-jet printing is used to apply the metamaterial to the substrate.

5. The method of claim 1, wherein the targeted frequency range is a microwave frequency range.

6. The method of claim 1, wherein the metamaterial layer in the multi-layered PCB assembly is mechanically fastened.

7. The method of claim 1, wherein the metamaterial layer in the multi-layered PCB assembly is thermoformed into a single sub-assembly.

8. A radio frequency absorbing (RFA) printed circuit board (PCB), prepared by a process comprising the steps of:
   applying a metamaterial to a substrate to create a metamaterial layer with an aspect ratio that provides attenuation in a targeted frequency range, wherein the metamaterial is constructed of spheres of a first dielectric constant and spheres of a second dielectric constant, wherein the spheres of the first dielectric constant and the spheres of the second dielectric constant are of a size based on a wavelength size of a frequency in the targeted frequency range, are dispersed uniformly in a semi-solid matrix formed into an electromagnetic absorber sheet, and have a packing density of four times the radius of the spheres; and forming the metamaterial layer into a multi-layered PCB assembly for absorption of electromagnetic radiation in the targeted frequency range.

9. The RFA PCB of claim 8, wherein Gravure printing is used to apply the metamaterial to the substrate.

10. The RFA PCB of claim 8, wherein pad printing is used to apply the metamaterial to the substrate.

11. The RFA PCB of claim 8, wherein Direct Write, dip-pen nanolithography (DPN) or e-jet printing is used to apply the metamaterial to the substrate.

12. The RFA PCB of claim 8, wherein the targeted frequency range is a microwave frequency range.

13. The RFA PCB of claim 8, wherein the metamaterial layer in the multi-layered PCB assembly is mechanically fastened.

14. The RFA PCB of claim 8, wherein the metamaterial layer in the multi-layered PCB assembly is thermoformed into a single sub-assembly.

15. A method for producing a perfect microwave absorbing (PMA) printed circuit board (PCB), the method comprising:

printing a metamaterial to a substrate to create a metamaterial layer with an aspect ratio that provides attenuation in a microwave frequency range, wherein the metamaterial is constructed of spheres of a first dielectric constant and spheres of a second dielectric constant, wherein the spheres of the first dielectric constant and the spheres of the second dielectric constant are of a size based on a wavelength size of a frequency in the targeted frequency range, are dispersed uniformly in a semi-solid matrix formed into an electromagnetic absorber sheet, and have a packing density of four times the radius of the spheres; and forming the metamaterial into a multi-layered PCB assembly for absorption of electromagnetic radiation in the microwave frequency range.

16. The method of claim 15, wherein Gravure printing is used to print the metamaterial to the substrate.

17. The method of claim 1, wherein the size of the spheres of the first dielectric constant and the spheres of the second dielectric constant is less than 1 millimeter.

18. The RFA PCB of claim 8, wherein the size of the spheres of the first dielectric constant and the spheres of the second dielectric constant is less than 1 millimeter.

* * * * *